(12) United States Patent
Oikawa et al.

(10) Patent No.: US 6,627,473 B1
(45) Date of Patent: Sep. 30, 2003

(54) COMPOUND SEMICONDUCTOR DEVICE WITH DELTA DOPED LAYER UNDER ETCHING STOPPER LAYER FOR DECREASING RESISTANCE BETWEEN ACTIVE LAYER AND OHMIC ELECTRODE AND PROCESS OF FABRICATION THEREOF

(75) Inventors: Hirokazu Oikawa, Tokyo (JP); Hitoshi Negishi, Tokyo (JP)

(73) Assignee: NEC Compound Semiconductor Devices, Ltd., Kawasaki (JP)

( * ) Notice: Subject to any disclaimer, the term of this patent is extended or adjusted under 35 U.S.C. 154(b) by 0 days.

(21) Appl. No.: 09/711,505

(22) Filed: Nov. 14, 2000

(30) Foreign Application Priority Data

Nov. 16, 1999 (JP) .......................................... 11-326193

(51) Int. Cl.⁷ .................... H01L 21/00; H01L 21/28; H01L 21/3205; H01L 81/072; H01L 81/109; H01L 81/0328; H01L 81/0336
(52) U.S. Cl. ........................ 438/46; 438/47; 438/572; 438/606; 257/194
(58) Field of Search .................... 257/190, 191, 257/192, 194; 438/46, 47, 606, 572

(56) References Cited

U.S. PATENT DOCUMENTS 4,780,748 A * 10/1988 Cunningham et al. ........ 257/24
5,172,197 A * 12/1992 Nguyen et al. .............. 257/190
5,313,093 A * 5/1994 Nakagawa ................... 257/194
5,420,442 A * 5/1995 Hasenberg et al. ......... 257/192
6,160,274 A * 12/2000 Folkes ........................ 257/191
6,204,102 B1 * 3/2001 Yoon et al. ................. 438/182

FOREIGN PATENT DOCUMENTS

| JP | 1-166568 | 6/1989 |
|----|----------|--------|
| JP | 7-7004 | 1/1995 |
| JP | 8-293505 | 11/1996 |
| JP | 9-115881 | 5/1997 |
| JP | 11-214676 | 8/1999 |
| JP | 11-297983 | 10/1999 |

* cited by examiner

Primary Examiner—Steven Loke
Assistant Examiner—Samuel A Gebremariam
(74) Attorney, Agent, or Firm—McGinn & Gibb, PLLC

(57) ABSTRACT

A high electron mobility transitor has a channel layer overlain by an electron supply layer held in contact with a gate electrode, and source/drain electrodes form ohmic contact together with cap layers, and resistive etching stopper are inserted between the cap layers and the electron supply layers for preventing the electron supply layer from over-etching, wherein extremely thin delta-doped layers are formed between the etching stopper layers and the electron supply layer so that the resistance between the electron supply layer and the source/drain electrodes are reduced.

22 Claims, 6 Drawing Sheets

COMPOUND SEMICONDUCTOR DEVICE WITH DELTA DOPED LAYER UNDER ETCHING STOPPER LAYER FOR DECREASING RESISTANCE BETWEEN ACTIVE LAYER AND OHMIC ELECTRODE AND PROCESS OF FABRICATION THEREOF

FIELD OF THE INVENTION

This invention relates to a compound semiconductor and, more particularly, to a compound semiconductor device having an etching stopper layer between an active layer and an ohmic electrode.

DESCRIPTION OF THE RELATED ART

A heterojunction metal-semiconductor field effect transistor is a typical example of the compound semiconductor device. The high electron mobility transistor is a kind of heterojunction metal-semiconductor field effect transistor, and is featured by an inversion layer at the boundary between an electron supply layer and a channel layer. The heterojunction metal-semiconductor field effect transistor finds a wide variety of application such as, for example, a DBS (Direct Broadcasting Satellite). The compound semiconductor device is expected to have low-noise characteristics and achieve a high-gain.

In order to enhance the mutual conductance, it is known to increase the dopant impurity in the electron supply layer. Reduction of source resistance is also appropriate. However, when the dopant concentration is uniformly increased in the electron supply layer, a problem is encountered in the hetero-junction metal-semiconductor field effect transistor in low withstand voltage between the gate electrode and the electron supply layer.

A stepped doping concentration structure has been proposed. When the stepped dopant concentration structure is applied to the electron supply layer, the electron supply layer has a relatively heavy dopant concentration close to the channel layer and a relatively light dopant concentration close to the gate electrode.

FIG. 1 illustrates the prior art high electron mobility transistor with the stepped dopant concentration structure. The prior art high electron mobility transistor is fabricated on a semi-insulating substrate 1, which is formed of gallium arsenide. The prior art high electron mobility transistor comprises a buffer layer 2, a channel layer 3, an electron supply layer 4/5, cap layers 8, ohmic electrodes 9 and a gate electrode 10. Gallium arsenide is epitaxially grown on the semi-insulating substrate 1, and forms a gallium arsenide layer. The gallium arsenide layer serves as the buffer layer 2. On the gallium arsenide layer is epitaxially grown indium gallium arsenide which forms an indium gallium arsenide layer serving as the channel layer 3. Heavily-doped n-type aluminum gallium arsenide, i.e., n$^+$Al$_{0.2}$Ga$_{0.8}$As and lightly-doped n-type aluminum gallium arsenide, i.e., n$^-$Al$_{0.2}$Ga$_{0.8}$As are successively epitaxially grown to 10 nanometers thick and 20 nanometers thick on the indium gallium arsenide layer, and form a heavily-doped n-type aluminum gallium arsenide layer 4 and a lightly-doped n-type aluminum gallium arsenide layer 5. The dopant concentration is $4\times10^{-18}$/cm$^3$ (4× $10^{-18}$/cm$^3$) in the heavily-doped n-type aluminum gallium arsenide layer 4 and $1\times10^{17}$/cm$^3$ in the lightly-doped n-type aluminum gallium arsenide layer 5. The heavily-doped n-type aluminum gallium arsenide layer 4 and the lightly-doped n-type aluminum gallium arsenide layer 5 form in combination the electron supply layer 4/5. The heavily-doped n-type aluminum gallium arsenide layer 4 is contiguous to the channel layer 3, and the gate electrode 10 is held in contact with the lightly-doped n-type aluminum gallium arsenide layer 5. The n-type dopant concentration is changed at the boundary between the heavily-doped n-type aluminum gallium arsenide layer 4 and the lightly-doped n-type aluminum gallium arsenide layer 5. Thus, the electron supply layer 4/5 has the stepped dopant concentration structure.

On the lightly-doped aluminum gallium arsenide layer 5 is epitaxially grown heavily-doped n-type gallium arsenide from which forms the cap layers 8 of 80 nanometers thick are formed. The dopant concentration is $3\times10^{18}$/cm$^3$ in the heavily-doped n-type gallium arsenide layer. Namely, the heavily-doped n-type gallium arsenide layer is partially etched so as to expose the electron supply layer 4/5 to a recess between the cap layers 8. The gate electrode 10 is held in contact with the exposed portion to the electron supply layer 5. On the other hand, the ohmic electrodes 9 are held in contact with the cap layers on both sides of the recess, and serve as a source electrode and a drain electrode.

The prior art high electron mobility transistor achieves a large mutual conductance by virtue of the heavily-doped n-type aluminum gallium arsenide layer 4 as well as a high withstand voltage by virtue of the lightly-doped n-type aluminum gallium arsenide layer 5. However, the threshold voltage and, accordingly, the amount of channel current are liable to fluctuate among the products. This is because of the fact that the etchant is liable to partially remove the lightly-doped n-type aluminum gallium arsenide layer 5 during the formation of the recess.

An etching stopper has been proposed as a countermeasure against the problem. The recess is formed by using mixture of citric acid and H$_2$O$_2$ as wet etchant. Upon completion of the fabrication process, the prior art high electron mobility transistor has the structure shown in FIG. 2.

The prior art high electron mobility transistor is fabricated on a semi-insulating substrate 1, which is formed of gallium arsenide. The prior art high electron mobility transistor comprises a buffer layer 2, a channel layer 3, an electron supply layer 4/5, etching stopper layers 7, cap layers 8, ohmic electrodes 9 and a gate electrode 10. Gallium arsenide is epitaxially grown on the semi-insulating substrate 1, and forms a gallium arsenide layer. The gallium arsenide layer serves as the buffer layer 2. On the gallium arsenide layer is epitaxially grown indium gallium arsenide which forms an indium gallium arsenide layer serving as the channel layer 3. Heavily-doped n-type aluminum gallium arsenide, i.e., n$^+$Al$_{0.2}$Ga$_{0.8}$As and lightly-doped n-type aluminum gallium arsenide, i.e., n$^-$Al$_{0.2}$Ga$_{0.8}$As are successively epitaxially grown to 10 nanometers thick and 20 nanometers thick on the indium gallium arsenide layer, and form a heavily-doped n-type aluminum gallium arsenide layer 4 and a lightly-doped n-type aluminum gallium arsenide layer 5. The dopant concentration is $4\times10^{18}$/cm$^3$ in the heavily-doped n-type aluminum gallium arsenide layer 4 and $1\times10^{17}$/cm$^3$ in the lightly-doped n-type aluminum gallium arsenide layer 5. The heavily-doped n-type aluminum gallium arsenide layer 4 and the lightly-doped n-type aluminum gallium arsenide layer 5 form in combination the electron supply layer 4/5. The heavily-doped n-type aluminum gallium arsenide layer 4 is contiguous to the channel layer 3, and the gate electrode 10 is held in contact with the lightly-doped n-type aluminum gallium arsenide layer 5. The n-type dopant concentration is changed at the boundary between the heavily-doped n-type aluminum gallium arsenide layer 4 and the lightly-doped n-type aluminum gallium arsenide layer 5. Thus, the electron supply layer 4/5 has the stepped dopant concentration structure.

On the lightly-doped aluminum gallium arsenide layer 5 is grown lightly-doped n-type aluminum gallium arsenide $n^-Al_{0.7}Ga_{0.3}As$ which forms a lightly-doped n-type aluminum gallium arsenide layer. The etching stopper layers 7 are formed from the lightly-doped n-type aluminum gallium arsenide layer. Heavily-doped n-type gallium arsenide is epitaxially grown to 80 nanometers thick on the lightly-doped n-type aluminum gallium arsenide layer 7, and forms a heavily-doped n-type gallium arsenide layer. The cap layers 8 are formed from the heavily-doped n-type gallium arsenide layer. The dopant concentration is $3 \times 10^{18}/cm^3$ in the heavily-doped n-type gallium arsenide layer. The heavily-doped n-type gallium arsenide layer 8 and the lightly-doped aluminum gallium arsenide layer 7 are partially etched so as to expose the electron supply layer 4/5 to a recess between the cap layers 8. The gate electrode 10 is held in contact with the exposed portion of the electron supply layer 5. On the other hand, the ohmic electrodes 9 are held in contact with the cap layers on both sides of the recess, and serve as a source electrode and a drain electrode.

The lightly-doped n-type $Al_{0.7}Ga_{0.3}As$ layer 7 gives an end point to the wet etchant in the formation of the recess, and prevents the lightly doped $Al_{0.8}Ga_{0.2}As$ layer 5 from the wet etchant. As a result, the electron supply layer 4/5 is constant in thickness, and the electron supply layer 4/5 keeps the threshold constant among products.

However, a problem is encountered in the prior art high electron mobility transistor shown in FIG. 2 in the high source resistance.

SUMMARY OF THE INVENTION

It is therefore an important object of the present invention to provide a compound semiconductor device, which is reduced in source resistance without sacrifice of the constant thickness of the active layer.

It is also an important object of the present invention to provide a process for fabricating the compound semiconductor device.

The present inventors contemplated the problem inherent in the prior art high electron mobility transistor shown in FIG. 2, and noticed that the $n^-Al_{0.7}Ga_{0.3}As$ etching stopper layers 7 were left between the electron supply layer 5 and the cap layers 8. Aluminum had the large composition ratio in the $n^-Al_{0.7}Ga_{0.3}As$. The aluminum was a large amount of dx center, and the dx centers were not activated with the n-type dopant impurity, i.e., silicon. Even though the silicon was doped in the $Al_{0.7}Ga_{0.3}As$, a non-ignoreable amount of n-type dopant impurities were invalid, and the lightly-doped $Al_{0.7}Ga_{0.3}As$ layer exhibited high resistivity. The present inventors replaced the lightly-doped $n^-Al_{0.7}Ga_{0.3}As$ etching stopper layers 7 with non-doped etching stopper layers. The high electron mobility transistor also exhibited large source resistance. The present inventors concluded that the resistance was to be reduced without deleting the etching stopper layer was required.

To accomplish the object, the present invention proposes to reduce the potential barrier between cap layers and an active layer by using delta-doped layers.

In accordance with one aspect of the present invention, there is provided a compound semiconductor device fabricated on a substrate comprising a multiple-layered structure including an active layer, plural cap layers respectively located over plural portions of the active layer, plural highly-resistive layers formed between the multiple-layered structure and the plural cap layers so as to form a recess located over a part of the multiple-layered structure and between the plural cap layers, plural delta-doped layers formed between the plural highly-resistive layers and the multiple-layered structure for decreasing potential barriers of the plural highly-resistive layers, a first electrode held in contact with the part of the multiple-layered structure for controlling the amount of current flowing through the active layer, and second electrodes respectively formed on the plural cap layers for providing current paths from and to the active layer through the plural cap layers, the plural highly-resistive layers and the plural delta-doped layers.

In accordance with another aspect of the present invention, there is provided a process for fabricating a compound semiconductor device comprising the steps of a) producing a multiple-layered structure having an active layer, a delta-doped layer over the active layer, a highly resistive layer over the delta-doped layer and a highly conductive layer over the delta-doped layer on a semi-insulating substrate, b) removing a part of the highly conductive layer so as to expose a part of the highly resistive layer to a first opening formed between remaining portions of the highly conductive layer serving as plural cap layers, c) removing the part of the highly resistive layer and a part of the delta-doped layer thereunder so as to expose a part of the active layer to a second opening formed between plural delta doped layers respectively overlain by highly resistive layers and d) completing a compound semiconductor device having a first electrode held in contact with the part of the active layer and second electrodes respectively held in contact with the plural cap layers.

BRIEF DESCRIPTION OF THE DRAWINGS

The features and advantages of the compound semiconductor device and the fabrication process will be more clearly understood from the following description taken in conjunction with the accompanying drawings in which.

DESCRIPTION OF THE PREFERRED EMBODIMENTS

First Embodiment

Figure 1:
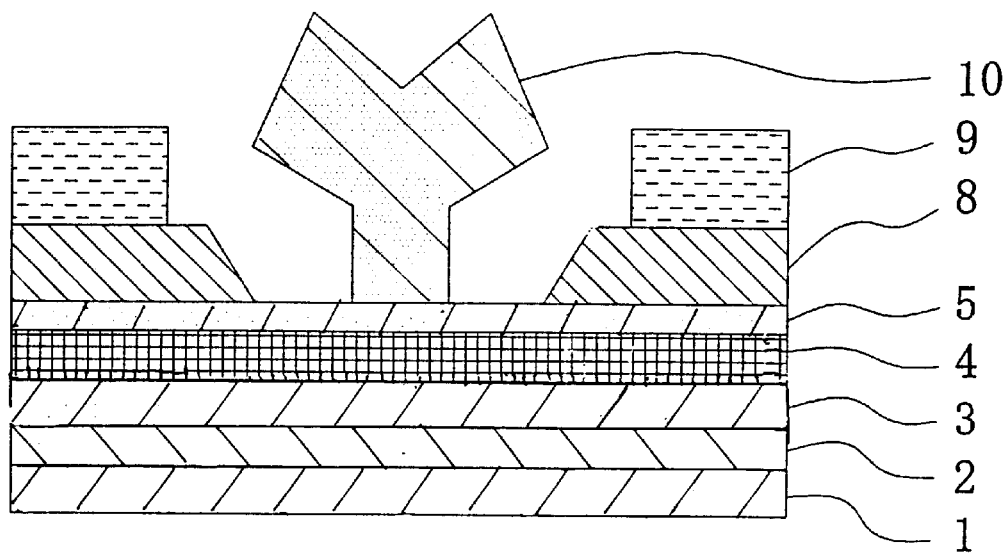
FIG. 1 is a cross sectional view showing the prior art high electron mobility transistor with the stepped dopant concentration structure.
Figure 2:
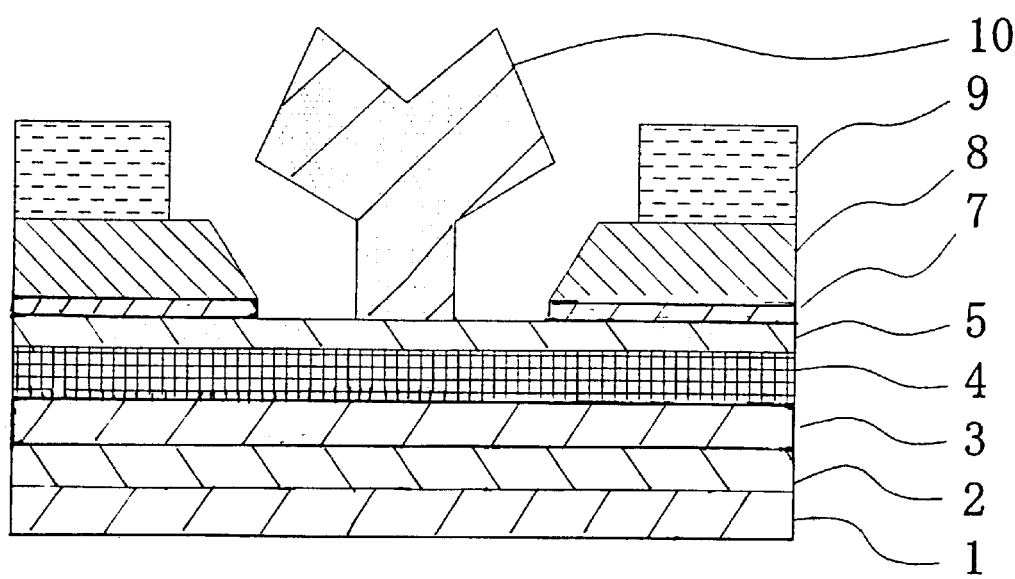
FIG. 2 is a cross sectional view showing the prior art high electron mobility transistor with the etching stopper between the electron supply layer and the cap layers.
Figure 3:
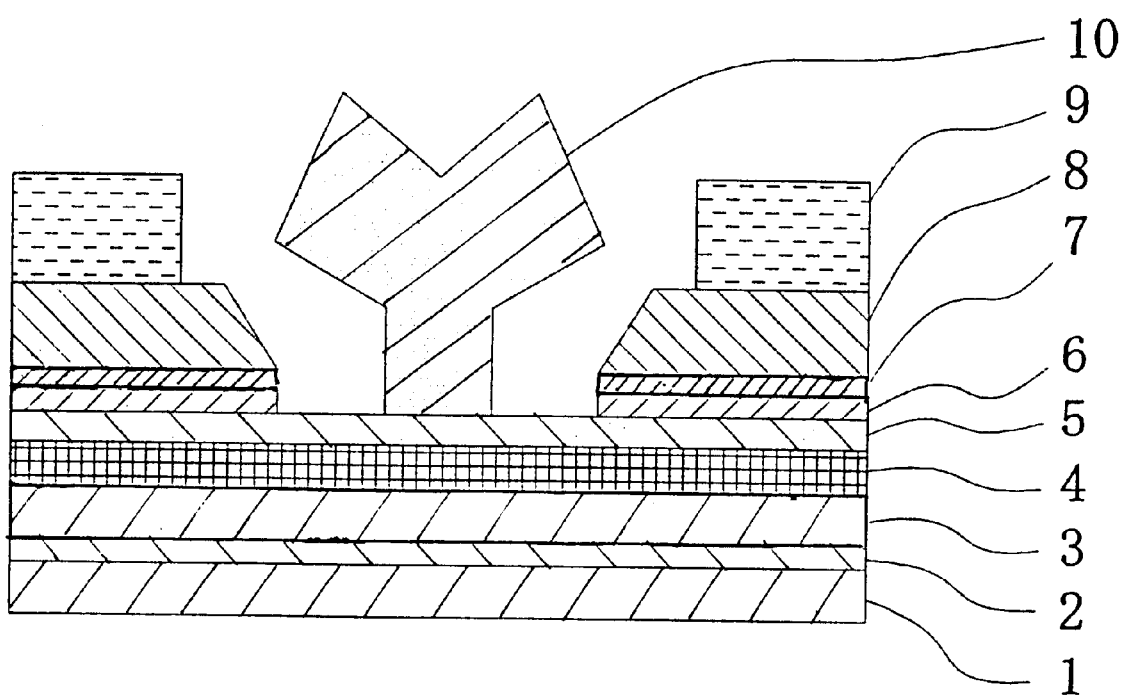
FIG. 3 is a cross sectional view showing the structure of a high electron mobility transistor according to the present invention.

Referring to FIG. 3 of the drawings, a high electron mobility transistor embodying the present invention is fabricated on a semi-insulating substrate 1 of gallium arsenide. The high electron mobility transistor comprises a buffer layer 2, a channel layer 3, an electron supply layer 4/5, delta doped layers 6, etching stopper layers 7, cap layers 8, ohmic electrodes 9 and a gate electrode 10. The delta doped layers are referred to as "planar dope layer" or "pulse dope layer" in several articles. In other words, the term "delta doped layer" is synonymous with the term "planar dope layer" and the term "pulse dope layer". The delta doped layers 6 are hereinlater described in detail.

The buffer layer 2 is formed of gallium arsenide epitaxially grown on the semi-insulating substrate 1 of gallium arsenide. The channel layer 3 is formed of indium gallium arsenide epitaxially grown on the gallium arsenide buffer layer 2. The electron supply layer 4/5 has the stepped dopant concentration structure, and the stepped dopant concentration structure is implemented by a heavily-doped n-type aluminum gallium arsenide layer 4 and a lightly-doped n-type aluminum gallium arsenide layer 5. The heavily-doped n-type aluminum gallium arsenide and the lightly-doped n-type aluminum gallium arsenide have the composition expressed as $Al_{0.2}Ga_{0.8}As$. The heavily-doped n-type aluminum gallium arsenide layer 4 is 10 nanometers thick, and the dopant concentration is $4 \times 10^{18}/cm^3$ in the heavily-doped n-type aluminum gallium arsenide layer 4. On the other hand, the lightly-doped n-type aluminum gallium arsenide layer 5 is 20 nanometers thick, and the dopant concentration is $1 \times 10^{17}/cm^3$ in the lightly-doped n-type aluminum gallium arsenide layer 5.

The delta doped layers 6 are formed by supplying Group-V element, i.e., arsenic (As) and silicon, only, and are as thin as a single atom to several atoms. The silicon is delta doped. For this reason, the dopant impurity, i.e., silicon is heavily contained in the delta doped layer 6. The dopant impurity concentration of the delta-doped layers 6 are heavier than that of the electron supply layer. In this instance, the delta doped layers 6 contain the silicon at $6 \times 10^{12}/cm^2$. The delta doped layers 6 contain only one kind of dopant impurity so that the tunneling phenomenon takes place at the boundaries. For this reason, the carriers can pass a potential barrier larger in height than the energy thereof.

The etching stopper layers 7 are formed of lightly-doped aluminum gallium arsenide epitaxially grown on the delta doped layers 6. The lightly-doped aluminum gallium arsenide is different in composition from that of the electron supply layer 4/5, and is expressed as $Al_{0.7}Ga_{0.3}As$. Although silicon is lightly doped into the aluminum gallium arsenide $Al_{0.7}Ga_{0.3}As$, the aluminum gallium arsenide $Al_{0.7}Ga_{0.3}As$ contains a large amount of dx centers, and the dx centers deactivate the silicon. For this reason, the effective carrier density is drastically decreased in the aluminum gallium arsenide etching stopper layers 7.

The cap layers 8 are formed from a heavily-doped n-type gallium arsenide layer epitaxially grown on the aluminum gallium arsenide etching stopper layers 7. The cap layers 8 are 80 nanometers thick, and the dopant concentration is $3 \times 10^{18}/cm^3$.

The heavily-doped n-type gallium arsenide layer 8, the lightly-doped aluminum gallium arsenide layer 7 and the delta doped layer 6 are partially etched away so that the electron supply layer 5 is exposed to a recess between the cap layers 8. The ohmic electrodes 9 are held in contact with the cap layers 8, and the gate electrode 10 is held in contact with the lightly-doped aluminum gallium arsenide layer 5 of the electron supply layer.

Figure 4:
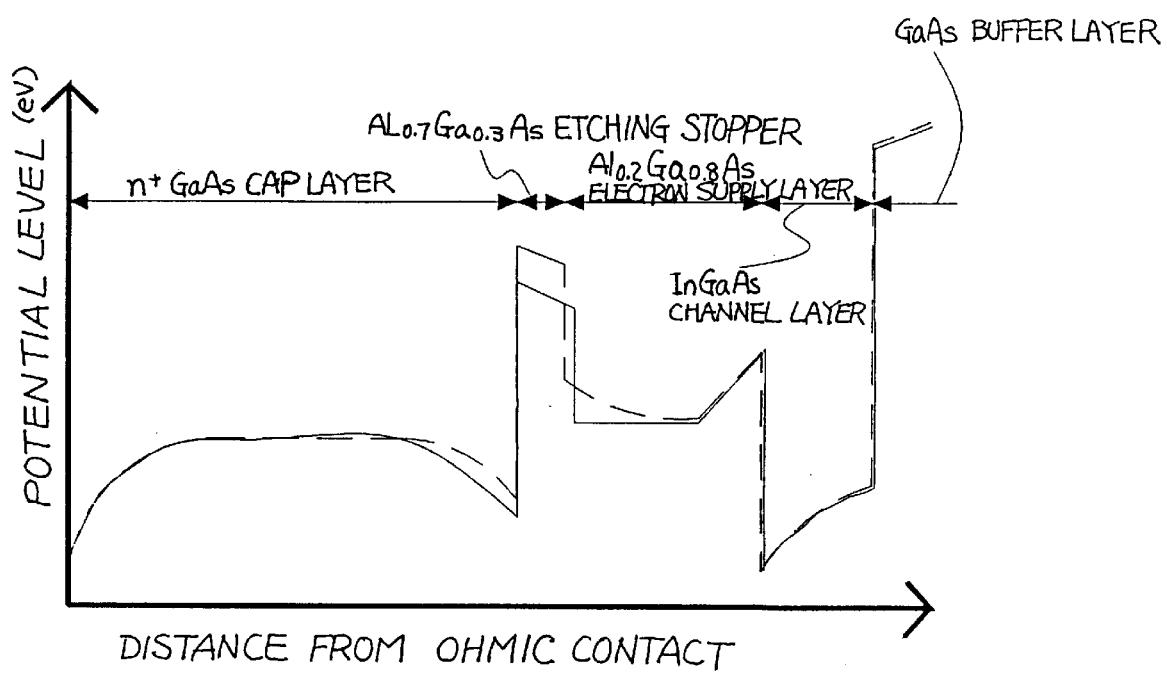
FIG. 4 is an energy band diagram showing the energy band created in the high electronic mobility transistor.

The energy band shown in FIG. 4 is created in the high electron mobility transistor according to the present invention. If the delta doped layers 6 are not inserted between the electron supply layer 4/5 and the etching stopper layers, the bottom edge of conduction band is represented by broken line. The potential barriers between the cap layers 8 and the etching stopper layers 7 and between the etching stopper layers 7 and the electron supply layer 5 are wide. The delta doped layers 6 make the potential level of the etching stopper layers 7 lower. The potential barriers between the cap layers 8 and the etching stopper layers 7 and between the etching stopper layers 7 and the electron supply layer 5 are made narrow. As a result, the carriers or electrons are smoothly moved between the ohmic electrodes 9 and the channel layer 3, and, accordingly, the resistance is decreased.

The etching stopper 7 keeps the electron supply layer 4/5 constant in thickness among the products. The electron supply layer 4/5 with constant thickness is effective against the fluctuation of threshold voltage. Thus, the high electron mobility transistor according to the present invention achieves the low resistance without sacrifice of the constant thickness of the electron supply layer 4/5.

Figure 5:
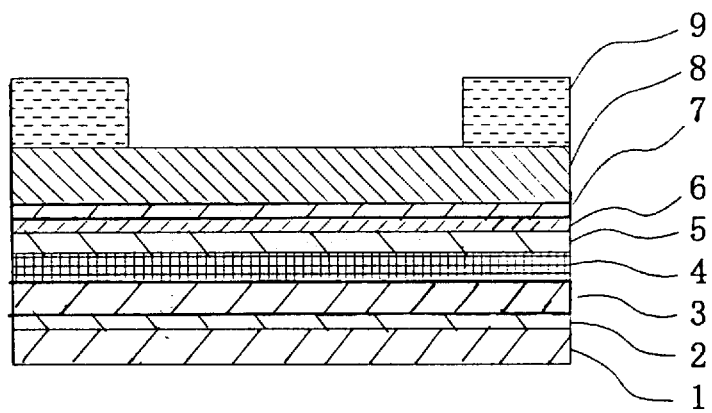
FIGS. 5A to 5C are cross sectional views showing a process for fabricating the high electron mobility transistor according to the present invention.
Figure 5:
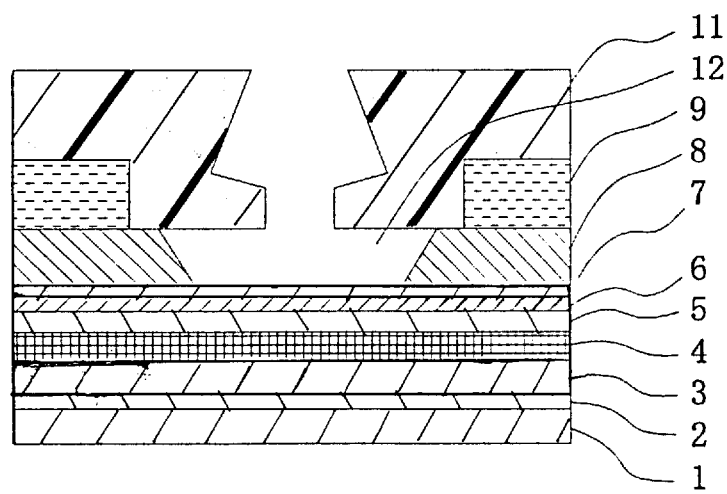
Figure 5:
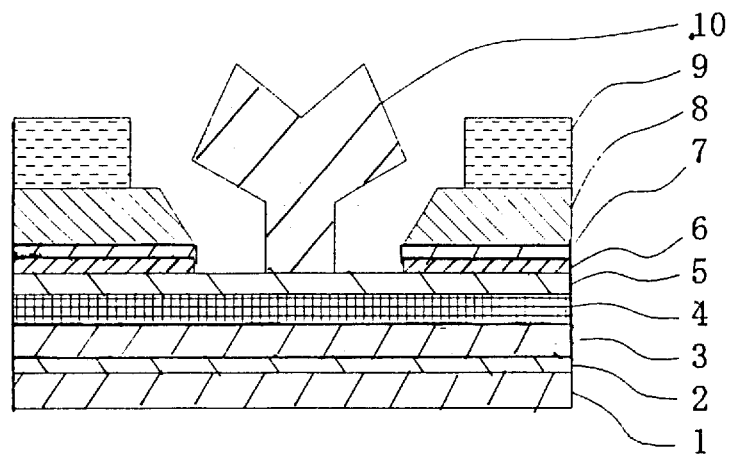

The high electron mobility transistor shown in FIG. 3 is fabricated through a process shown in FIGS. 5A to 5C. In the following description, compound semiconductor layers are labeled with the references designating the layers of the high electron mobility transistor shown in FIG. 3.

The process starts with preparation of the semi-insulating substrate 1. The gallium arsenide layer 2, the indium gallium arsenide layer 3, the heavily-doped aluminum gallium arsenide layer 4, the lightly-doped aluminum gallium arsenide layer 5, the delta doped layers 6, the aluminum gallium arsenide layer 7 and the heavily-doped gallium arsenide layer 8 are epitaxially grown on the semi-insulating substrate 1 in succession. Nickel-gold-germanium alloy Ni/AuGe is grown on the heavily-doped gallium arsenide layer 8, and the ohmic electrodes 9 are formed from the nickel-gold-germanium alloy layer. The resultant semiconductor structure in this stage is shown in FIG. 5A.

Subsequently, a photo resist mask 11 is provided on the resultant semiconductor structure by using a photo-lithography. Namely, photo-resist solution is spread over the resultant semiconductor structure, and is baked so as to form a photo-resist layer. A pattern image is transferred from a photo-mask to the photo-resist layer so as to produce a latent image in the photo-resist layer. The latent image is developed. Then, the photo-resist mask 11 is left on the resultant semiconductor structure. A part of the heavily-doped gallium arsenide layer 8 is exposed to the opening formed in the photo-resist mask 11. Using wet etchant containing citric acid and hydrogen peroxide $H_2O_2$, the heavily-doped gallium arsenide layer 8 is partially removed. Since the wet etchant has the selectivity larger to the gallium arsenide than to the lightly-doped n-type aluminum gallium arsenide $Al_{0.7}Ga_{0.3}As$, the wet etching is terminated on the lightly-doped n-type aluminum gallium arsenide $Al_{0.7}Ga_{0.3}As$ layer 7, and a recess 12 is formed in the heavily-doped n-type gallium arsenide layer 8 as shown in FIG. 5B. Thus, the lightly-doped n-type aluminum gallium arsenide $Al_{0.7}Ga_{0.3}As$ layer 7 serves as an etching stopper. While the lightly-doped n-type aluminum gallium arsenide $Al_{0.7}Ga_{0.3}As$ layer 7 is being etched with the wet etchant, the exposed portion of the lightly-doped n-type aluminum gallium arsenide $Al_{0.7}Ga_3As$ etching stopper layer 7 is oxidized, and aluminum oxide $Al_2O_3$ is left on the delta-doped layers 6.

As described hereinbefore, the lightly-doped n-type aluminum gallium arsenide $Al_{0.7}Ga_{0.3}As$ layer 7 contains a large amount of dx centers. For this reason, the dopant impurity, i.e., silicon atoms are hardly activated, and the actual carrier concentration is drastically reduced. This means that the lightly-doped n-type aluminum gallium arsenide $Al_{0.7}Ga_{0.3}As$ layer 7 is highly resistive.

The aluminum oxide layer and the delta-doped layers 6 under the aluminum oxide layer are etched away by using hydrochloric acid. The lightly-doped n-type aluminum gallium arsenide layer 5 is hardly etched so that the high electron mobility transistor is constant in threshold and the amount of channel current among products. Finally, titanium-aluminum alloy is deposited over the entire surface by using an evaporation technique, and the photo-resist mask 11 is stripped off together with the titanium-aluminum alloy deposited thereover. The gate electrode 10 is left on the electron supply layer 4/5 as shown in FIG. 5C.

As will be understood from the foregoing description, the potential barrier of the etching stopper layer 7 is lowered by virtue of the delta-doped layers 6, and the resistance between the ohmic electrodes 9 and the electron supply layer 4/5 is decreased. As a result, the source resistance of the high electron mobility transistor is reduced, and the high-frequency characteristics such as, for example, the noise factor and the gain are improved.

The delta-doped layers are removed from the upper surface of the electron supply layer 4/5 exposed to the recess 12. This means that the gate electrode 10 is directly held in contact with the electron supply layer 4/5. This results in a small amount of gate leakage current and a high gate-and-drain withstand voltage.

In the first embodiment, the channel layer 3 and the electron supply layer 4/5 as a whole constitute an active layer.

Second Embodiment

Figure 6:
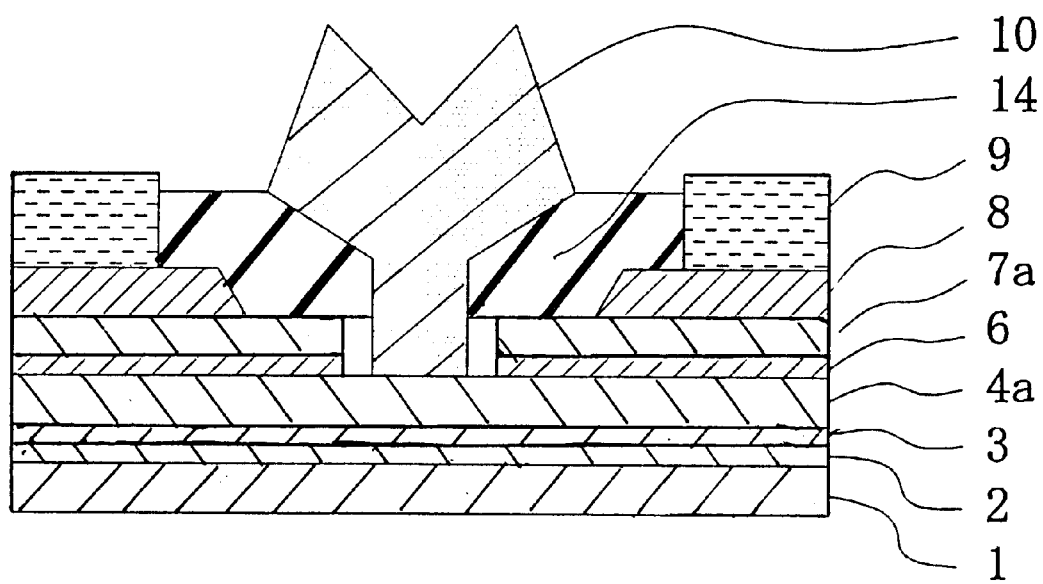
FIG. 6 is a cross sectional view showing the structure of a heterojunction metal-semiconductor field effect transistor according to the present invention.

FIG. 6 illustrates another high electron mobility transistor embodying the present invention. The high electron mobility transistor is fabricated on a semi-insulating substrate 1 of gallium arsenide. The high electron mobility transistor comprises a buffer layer 2, a channel layer 3, an electron supply layer 4a, delta doped layers 6, undoped gallium arsenide layer 7a, cap layers 8, ohmic electrodes 9, a gate electrode 10 and a protective layer 14.

The buffer layer 2 is formed of gallium arsenide epitaxially grown on the semi-insulating substrate 1 of gallium arsenide. The channel layer 3 is formed of indium gallium arsenide epitaxially grown on the gallium arsenide buffer layer 2. The electron supply layer 4a is formed of n-type gallium arsenide, and the dopant concentration is $1\times10^{18}/cm^3$ in the n-type gallium arsenide electron supply layer 4a. The n-type gallium arsenide electron supply layer 4a is 30 nanometers thick.

The delta doped layers 6 are similar to those of the first embodiment, and no further description is incorporated hereinbelow for avoiding repetition. The undoped gallium arsenide layers 7a are 20 nanometers thick. An etching stopper layer may be inserted between the cap layers 8 and the undoped gallium arsenide layers 7a.

The cap layers 8 are formed from a heavily-doped n-type gallium arsenide layer epitaxially grown on the undoped gallium arsenide layers 7a. The cap layers 8 are 80 nanometers thick, and the dopant concentration is $3\times10^{18}/cm^3$.

The heavily-doped n-type gallium arsenide layer 8, the undoped gallium arsenide layer 7a and the delta doped layer 6 are partially removed, and a part of the n-type gallium arsenide layer 4a is exposed to a recess between the undoped gallium arsenide layers 7a. The ohmic electrodes 9 are held in contact with the cap layers 8, and the gate electrode 10 is held in contact with the n-type gallium arsenide electron supply layer 4a. The protective layer 14 is formed of silicon dioxide, and fills an upper portion of the recess.

The high electron mobility transistor is fabricated as follows. The process starts with preparation of the semi-insulating substrate 1. The gallium arsenide layer 2, the indium gallium arsenide layer 3, the n-type gallium arsenide layer 4a, the delta doped layer 6, the undoped gallium arsenide layer 7a and the heavily-doped n-type gallium arsenide layer 8 are epitaxially grown on the major surface of the semi-insulating substrate 1.

Figure 7:
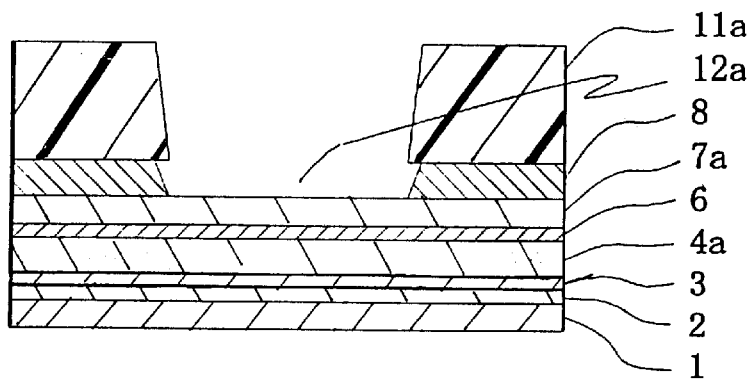
FIGS. 7A to 7D are cross sectional views showing a process for fabricating the heterojunction metal-semiconductor field effect transistor according to the present invention.
Figure 7:
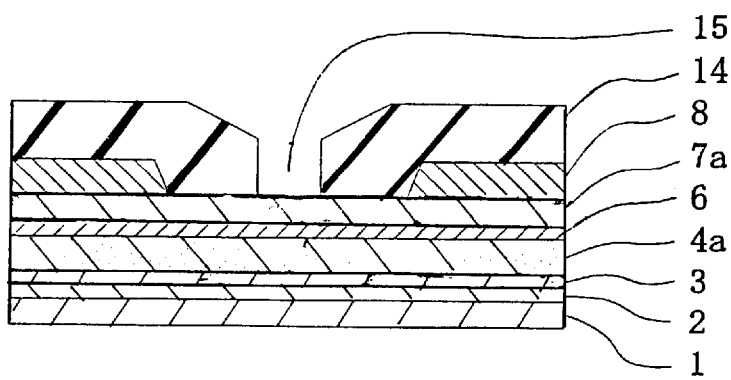
Figure 7:
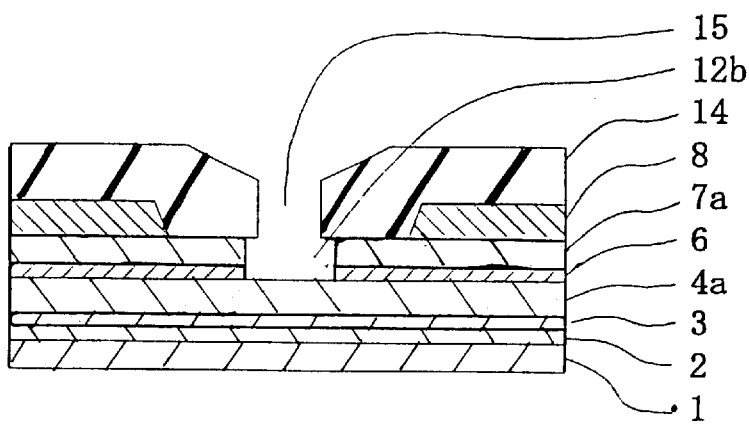
Figure 7:
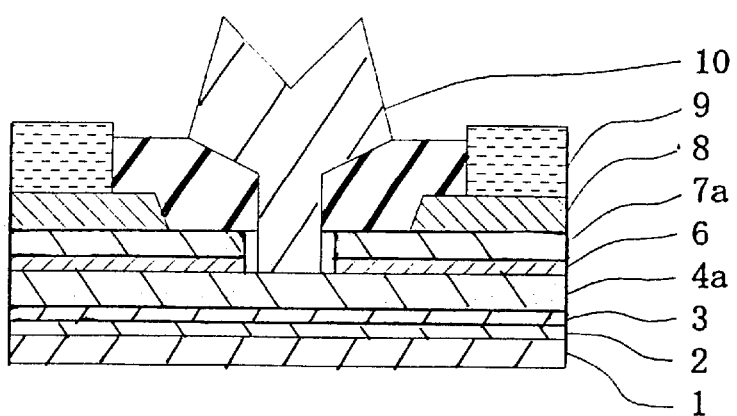

A photo-resist etching mask 11a is formed on the heavily-doped n-type gallium arsenide layer 8 through the photo-lithographic techniques. Using the photo-resist etching mask 11a, the heavily-doped n-type gallium arsenide layer 8 is partially etched away, and a wide recess 12a takes place in the heavily-doped n-type gallium arsenide layer 8. The remaining portions of the heavily-doped n-type gallium arsenide layer 8 serve as the cap layers 8. The resultant semiconductor structure is shown in FIG. 7A. In the case where the etching stopper layer of aluminum gallium arsenide layer is inserted between the undoped gallium arsenide layer 7a and the heavily-doped n-type gallium arsenide layer 8, the etching is exactly terminated at the etching stopper layer.

Silicon dioxide is deposited over the entire surface of the resultant semiconductor structure by using a chemical vapor deposition. The silicon dioxide forms a silicon dioxide layer 14. A photo-resist etching mask (not shown) is formed on the silicon dioxide layer 14, and has an opening over the n-type gallium arsenide layer where the gate electrode 10 is to be formed. Using the photo-resist etching mask, the silicon dioxide layer is partially etched away, and a gate opening 15 is formed in the silicon dioxide layer 14 as shown in FIG. 7B.

Subsequently, the undoped gallium arsenide layer 7a and the delta-doped layer 6 are partially etched away by using the photo-resist etching mask. This results in a gate recess 12b, and the part of the n-type gallium arsenide electron supply layer 4a is exposed to the gate recess 12b as shown in FIG. 7C.

WSi—TiN—Pt-Au alloy is deposited over the entire surface of the resultant semiconductor structure by using a sputtering technique, and the alloy is patterned into the gate electrode 10 by using the photo-lithographic techniques followed by an etching. Finally, the ohmic electrodes 9 of Ni—AuGe alloy is formed on the cap layers 8, and the high electron mobility transistor is obtained as shown in FIG. 7D.

As similar to the high electron mobility transistor implementing the first embodiment, the delta-doped layers 6 lower the potential barriers of the undoped gallium arsenide layers 7a, and decrease the resistance between the channel layer 3 and the ohmic electrodes 9. Even though the delta-doped layers 6 are inserted between the undoped gallium arsenide layers 7a and the n-type gallium arsenide electron supply layer 4a, the gate electrode 10 is directly held in contact with the n-type gallium arsenide electron supply layer 4a. For this reason, the leakage current is not increased, and the gate-and-drain withstand voltage (BVgd) is not lowered.

Although particular embodiments of the present invention have been shown and described, it will be apparent to those skilled in the art that various changes and modifications may be made without departing from the spirit and scope of the present invention.

In the first embodiment, the etching stopper layers 7 are formed of $Al_{0.7}Ga_{0.3}As$. The composition ratio of aluminum is allowed to be different from 0.7 in so far as the aluminum gallium arsenide gives the end point to the etchant.

A dry etching technique is available for the step for patterning the heavily-doped n-type gallium arsenide layer 8. The heavily-doped n-type gallium arsenide layer 8 may be patterned by using another kind of etchant such as, for example, gaseous mixture of $BCl_3$ and $SF_6$ or another kind of gaseous mixture of $SiCl_4$ and $SF_6$.

The metal-semiconductor field effect transistor implementing the first embodiment may not be equipped with any electron supply layer. The standard metal-semiconductor field effect transistor may have the structure comprising a gallium arsenide buffer layer 2, an $n^+Al_{0.2}Ga_{0.8}As/n^-Al_{0.2}Ga_{0.8}As$ channel layer 4/5, delta doped layers 6, $n^-Al_{0.7}Ga_{0.3}As$ etching stopper layers 7 and $n^+GaAs$ cap layers 8. The standard metal-semiconductor field effect transistor may be categorized in the metal-semiconductor Schottky field effect transistor. The metal-semiconductor Schottky field effect transistor may comprise a gallium arsenide buffer layer 2, an $n^+Al_{0.2}Ga_{0.8}As/n^-Al_{0.2}Ga_{0.8}As$ channel layer 4/5, delta doped layers 6, $n^-Al_{0.7}Ga_{0.3}As$ etching stopper layers 7 and $n^+GaAs$ cap layers 8.

The undoped gallium arsenide layer 7a may be replaced with another kind of undoped compound semiconductor layer such as, for example, undoped aluminum gallium arsenide layer or undoped indium gallium arsenide layer.

What is claimed is:

1. A process for fabricating a compound semiconductor device, comprising:
    a) producing a multiple-layered structure having an active layer, a delta-doped layer over said active layer, a highly resistive layer over said delta-doped layer and a highly conductive layer over said delta-doped layer on a semi-insulating substrate;
    b) removing a part of said highly conductive layer so as to expose a part of said highly resistive layer to a first opening formed between remaining portions of said highly conductive layer serving as plural cap layers using a mixture of citric acid and hydrogen peroxide, wherein said removing is terminated by oxidizing the highly resistive layer in the mixture;
    c) removing said part of said highly resistive layer and a part of said delta-doped layer thereunder so as to expose a part of said active layer to a second opening formed between plural delta doped layers respectively overlain by highly resistive layers using hydrochloric acid; and
    d) completing a compound semiconductor device having a first electrode held in contact with said part of said active layer and second electrodes respectively held in contact with said plural cap layers.

2. The process as set forth in claim 1, in which said highly resistive layer serves as an etching stopper carried out in said step b) so as to prevent said active layer from a first etchant.

3. The process as set forth in claim 2, in which step b) includes the sub-steps of
    b-1) forming an etching mask on said highly conductive layer, and
    b-2) exposing said highly conductive layer to said first etchant having a large selectivity to a first kind of compound semiconductor forming said highly conductive layer with respect to a second kind of compound semiconductor forming said highly resistive layer.

4. The process as set forth in claim 3, in which said first etchant contains an oxidizing agent for producing an oxide from said second kind of compound semiconductor.

5. The process as set forth in claim 4, in which a second etchant is used for removing said oxide and said part of said delta-doped layer, and has a large selectivity to said oxide and said delta-doped layer with respect to a third kind of compound semiconductor forming said active layer.

6. The process as set forth in claim 4, in which said oxidizing agent is hydrogen peroxide, and said first kind of compound semiconductor and said second kind of compound semiconductor contain a negligible amount of aluminum and a large amount of aluminum, respectively.

7. The process as set forth in claim 6, in which said first etchant further contains citric acid, and said first kind of compound semiconductor and said second kind of compound semiconductor are gallium arsenide and aluminum gallium arsenide, respectively.

8. The process as set forth in claim 1, in which said step b) includes the sub-steps of
    b-1) depositing an oxide over said highly conductive layer for forming an oxide layer,
    b-2) partially removing said oxide layer for forming an etching mask, and
    b-3) etching said part of said highly conductive layer by using said etching mask.

9. The process as set forth in claim 8, in which said etching mask serves as a protective layer surrounding said first electrode.

10. The process of claim 1, wherein said active layer comprises a doped electron supply layer.

11. The process of claim 10, wherein said doped electron supply layer comprises:
    a heavily doped n-type aluminum gallium arsenide layer; and
    a lightly doped n-type aluminum gallium arsenide layer on said heavily doped layer.

12. The process of claim 11, wherein said heavily doped layer comprises a dopant concentration of about $4\times10^{18}/cm^3$.

13. The process of claim 11, wherein said lightly doped layer comprises a dopant concentration of about $4\times10^{17}/cm^3$.

14. The process of claim 11, wherein said heavily doped layer comprises $Al_{0.2}Ga_{0.8}As$.

15. The process of claim 11, wherein said lightly doped layer comprises $Al_{0.2}Ga_{0.8}As$.

16. The process of claim 1, wherein said highly conductive layer comprises an etching stopper layer.

17. The process of claim 16, wherein said etching stopper layer comprises a lightly doped $Al_{0.7}Ga_{0.3}As$ layer.

18. The process of claim 1, wherein said producing of said delta-doped layer comprises supplying a Group V element.

19. The process of claim 18, wherein the dopant in said delta-doped layer comprises silicon.

20. The process of claim 19, wherein said delta-doped layer comprises the silicon dopant at about $6\times10^{12}/cm^2$.

21. The process of claim 1, wherein the delta-doped layer comprises a heavier dopant impurity concentration than that of the active layers.

22. The process of claim 1, wherein the delta-doped layer comprises a single type of dopant impurity.

* * * * *